United States Patent [19]
Vu et al.

[11] Patent Number: 5,710,563
[45] Date of Patent: Jan. 20, 1998

[54] PIPELINE ANALOG TO DIGITAL CONVERTER ARCHITECTURE WITH REDUCED MISMATCH ERROR

[75] Inventors: Ha Vu, San Jose; Ion Opris, Sunnyvale; Kevin E. Brehmer, San Jose, all of Calif.

[73] Assignee: National Semiconductor Corporation, Santa Clara, Calif.

[21] Appl. No.: 780,991

[22] Filed: Jan. 9, 1997

[51] Int. Cl.$^6$ .................................................. H03M 1/14
[52] U.S. Cl. .................................. 341/161; 341/155
[58] Field of Search ........................... 341/161, 118, 341/120, 155, 156, 158, 162, 163

[56] References Cited

U.S. PATENT DOCUMENTS

| | | | |
|---|---|---|---|
| 5,534,864 | 7/1996 | Ono et al. | 341/156 |
| 5,635,937 | 6/1997 | Lim et al. | 341/161 |

OTHER PUBLICATIONS

Yu, et al., "A 2.5V 12b 5MSample/s Pipelined CMOS ADC", IEEE International Solid-State Circuits Conference, pp. 314–315, Feb. 1996.

Yu, et al., "A Pipelined A/D Conversion Technique with Near-Inherent Monotonicity", IEEE Transactions on Circuits and Systems-II, Analog and Digital Signal Processing, vol. 42, No. 7, pp. 500–502 Jul. 1995.

Lewis, et al., "A 10-b 20-Msample/s Analog-to-Digital Converter", IEEE Journal of Solid State Circuits, vol. 27, No. 3 pp. 351–358, Mar. 1992.

*Primary Examiner*—Brian K. Young
*Attorney, Agent, or Firm*—Limbach & Limbach L.L.P.; Seong-Kun Oh

[57] ABSTRACT

A multistage pipelined analog to digital converter architecture that significantly reduces non-linearity by a novel control switching technique is introduced. A first aspect of the present invention embraces a sample and hold circuit that includes a logic circuit, a plurality of reference signal nodes, an input signal node, an output signal node, a sample signal node, a first switching node, a second switching node, a circuit reference node, a first capacitor, a second capacitor, a signal routing circuit, and amplifier, which are intercoupled to provide an output analog residue signal. At each stage of the pipelined architecture the sample and hold switch control logic alternately samples and amplifies signals inputted thereto and effectively reduce capacitor mismatch errors. This has the advantageous result of reducing non-linearity. According to a second aspect, the sample and hold circuit uses a differential amplifier having an inverting input and a non-inverting input. This second aspect further employs sequential termination of the amplifying time period resulting in additional advantage of reducing charge injection.

15 Claims, 11 Drawing Sheets

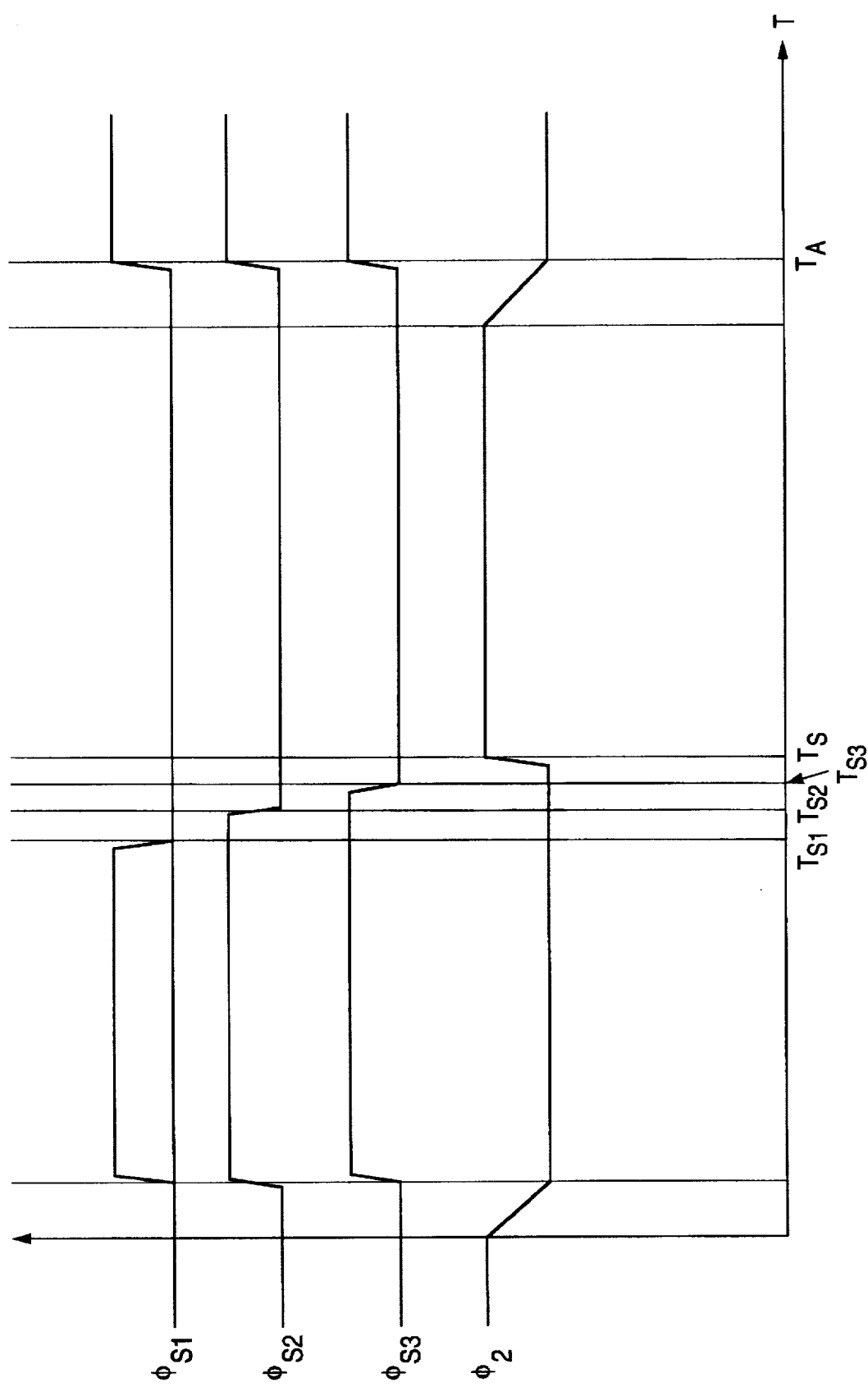

PIPELINE ANALOG TO DIGITAL CONVERTER ARCHITECTURE WITH REDUCED MISMATCH ERROR

BACKGROUND OF THE INVENTION

1. Field of the Invention

The present invention relates to the field of analog-to-digital conversion. More particularly, the present invention relates to a multistage pipelined analog-to-digital converting architecture.

2. Description of the Related Art

Analog-to-digital (A/D) converters with pipelined architecture are well suited for low-power, high speed applications. Among the several of the currently used high conversion speed techniques such as flash, multi-step, pipeline, interpolating, and time-interleaved successive approximation, the pipelined technique offers the best trade-off between minimizing circuit complexity, silicon area, and power consumption with respect to conversion speed. The pipelined architecture can generally provide high throughput rates and occupy small die areas which are both desirable and cost efficient in A/D converters. These advantages result from the concurrent operation of each of the multiple stages in the pipelined architecture.

Broadly speaking, at any given time during the operation of the pipelined A/D converter, the first stage operates on the most recent sample inputted while subsequent stages in the pipelined architecture concurrently operate on residues from the previous samples outputted from prior stages of the cascaded pipeline architecture.

In addition, a redundancy in stage bit resolution can be introduced to provide a pipelined A/D architecture with sufficiently large tolerance for non-ideal component characteristics. In particular, by providing a sum of the individual stage resolutions to be greater than the total resolution of the output digital signal, and by eliminating this redundancy with a digital correction algorithm, the effects of quantizer nonlinearity and interstage offset on the overall linearity can be significantly improved.

A conventional k stage pipelined A/D converter generally comprises multiple stages connected in series. FIG. 1 shows a block diagram of the k stage pipelined A/D converter. Each stage from 101 to 101(k) is made up of a sample-and-hold (S/H) circuit 102, a low resolution A/D subconverter 103, a low resolution digital-to-analog (D/A) converter 104, and a subtracter 105. In operation, each of the stages 101 to 101(k) of the pipelined A/D converter in FIG. 1 initially samples and holds the output from the previous stage with the S/H circuit 102. Since stage 101 is the first stage in the pipelined architecture, it samples and holds an analog input signal. Then the held input is converted into a digital code of a predetermined resolution by the A/D subconverter 103 and back into an analog signal by the D/A converter 104. Finally, the analog output from the D/A converter 104 is subtracted from the analog input held by the S/H circuit 102 to produce an analog residue signal that is sent to the next stage for similar operation.

FIG. 2 shows a schematic diagram of a conventional 1.5-bit resolution stage. It consists of an amplifier 201, two equal-sized capacitors 202 and 203, and a several switches 204, 205, 206, 207 and 208. The two clocks $\phi 1$ and $\phi 2$ and are nonoverlapping. During the sampling time period, $\phi 1$ is high, the inverting input 209 of the amplifier 201 is connected to ground 213 and the Sample-and-Hold Amplifier input 211 is connected to the sampling capacitor 202 and the integrating capacitor 203 resulting in the input 211 being sampled onto both capacitors 202 and 203. During the amplifying time period, $\phi 2$ is high, the integrating capacitor 203 is connected to the amplifier output 212, and the sampling capacitor 202 is connected to the positive reference 205, the negative reference 206, or ground depending on the state of the digital output code XY. More specifically, switches 206, 204 and 205 are alternately closed when the digital output code is 00, 01, and 10, respectively, during the amplifying time period.

The resulting output consists of two parts: one arising from the feedforward of the integrating capacitor 203, and another arising from the charge transfer between the sampling capacitor 202 and the integrating capacitor 203. Since only the latter is dependent upon the charge transfer between the sampling capacitor 202 and the integrating capacitor 203, the feedforward reduces the effect of capacitor mismatch on the interstage gain. This is important because the accuracy of the interstage gain of 2 determines the linearity of the A/D converter. Since the digital output codes only control capacitor 202 during the amplifying time period, this D/A converter generates only three levels corresponding thereto.

FIG. 3A illustrates an ideal response of the residue voltage for input voltages ranging from $-V_{REF}$ to $+V_{REF}$ of one stage in a pipelined architecture with an interstage amplifier having a gain of 2. For output digital code 00, the residue voltage from each stage of the 1.5-bit pipelined converter can be represented by the following expression.

$$V_{RES1}=V_{IN}*(130\ (C_S/C_I)+V_{REF}*(C_S/C_1) \tag{1}$$

Where $-V_{REF} < V_{IN} < -V_{REF}/4$.

Similar expressions can be determined for other ranges of the input voltage. For example, for output digital code 01, the residue voltage can be shown by the following expression.

$$V_{RES2}=V_{IN}*(1+(C_S/C_I) \tag{2}$$

Where $-V_{REF}/4 < V_{IN} < +V_{REF}/4$.

Finally, for output digital code 10, the residue voltage can be shown by the following expression.

$$V_{RES3}=V_{IN}*(1+(C_S/C_I)-V_{REF}*(C_S/C_I) \tag{3}$$

Where $-V_{REF}/4 < V_{IN} < +V_{REF}$.

At the transition points where at least one bit of the output digital code XY changes, the change in residue voltage can be ascertained. For example, where the output digital code changes from 00 to 01, the change in residue voltage can be expressed as follows.

$$\Delta V_1 = (V_{RES1}-V_{RES2})|V_{in}=-V_{REF}/4 \tag{4}$$

And, for output digital code change from 01 to 10, we have the following expression.

$$\Delta V_2 = (V_{RES2}-V_{RES3})|V_{IN}=+V_{REF}/4 \tag{5}$$

For an ideal response, no capacitor mismatch would occur, and the following expression holds true.

$$C_I = C_S \tag{6}$$

Substituting (6) into equations (1), (2), and (3), and into (4) and (5) thereafter, we derive at the following expressions.

$$\Delta V_1 = \Delta V_2 = V_{REF} \qquad (7)$$

FIG. 3A illustrates this result clearly. At transition points $V_{IN} = -V_{REF}/4$ and $V_{IN} = +V_{REF}/4$, the change in input voltage is $V_{REF}/2 - (-V_{REF}/2)$, which equals $V_{REF}$, as shown by the above expression (7).

In practice, however, the existence of component mismatch tends to result in a less than ideal residue voltage response. In specific, capacitor mismatch deteriorates conversion accuracy thereby affecting linearity. Where the mismatch is significant, converting from an analog signal to a digital signal may lead to a loss of information or "clipping" of signals.

Where capacitor mismatch exists, equation (6) is modified to the following expression.

$$C_S = (1+\alpha) * C_1 \qquad (8)$$

Where $\alpha$ is assumed to represent the mismatch factor between the capacitors. Then, equations (1), (2), and (3) are modified to the following expressions.

$$V_{RES1} = V_{IN} * (2+\alpha) + V_{REF} * (1+\alpha) \qquad (9)$$

for $-V_{REF} < V_{IN} < -V_{REF}/4$, $$V_{RES2} = V_{IN} * (2+\alpha) \qquad (10)$$

for $-V_{REF}/4 < V_{IN} < +V_{REF}/4$, $$V_{RES3} = V_{In} * (2+\alpha) - V_{REF} * (1+\alpha) \qquad (11)$$

for $+V_{REF}/4 < V_{IN} < +V_{REF}$.

Furthermore, the changes in residue voltages $\Delta V_1$ and $\Delta V_2$ at output digital code transition points can be shown as the following expressions.

$$\Delta V_1 = V_{RES1} - V_{RES2} = V_{REF} * (1+\alpha) \qquad (12)$$

$$\Delta V_2 = V_{RES2} - V_{RES3} = V_{REF} * (1+\alpha) \qquad (13)$$

Where again, $\alpha$ represents the capacitor mismatch factor.

The deviation of the residue voltage drop at transition points $-V_{REF}/4$ and $+V_{REF}/4$ from the ideal reference voltage $V_{REF}$ causes differential nonlinearity and may cause non-monotonicity if the deviation is sufficiently large.

FIG. 3B illustrates a residue voltage plot of a conventional converter stage of the 1.5-bit pipelined A/D converter as shown in FIG. 2. Capacitor mismatching is shown by the non-overlapping portion between the ideal response 311 and the actual response 312. In addition, it can be seen from FIG. 3B that at output digital code transition points where the input voltage $V_{IN}$ equals $-V_{REF}/4$ and $+V_{REF}/4$, the magnitude of the actual residue response 312 exceeds the ideal response 311. This indicates that there will be some gain error due to capacitor mismatch which will result in non-linearity.

The linearity of the pipelined A/D converter is dependent upon the linearity of the first stage which produces the most significant digital output bits. Although a high number of bits in the first stage relaxes matching requirements, it increases complexity and reduces speed.

A 10-bit 20M sample per second A/D converter with nine stage pipelined architecture is disclosed by Lewis et al in "A 10-b 20M sample/s Analog-to-Digital Converter" IEEE, Journal of Sold State Circuits, vol. 27, Nov. 3, March 1992, pp. 351–58. This structure, however, falls to take account of the mismatch error resulting from capacitor mismatch. Therefore, a pipelined multi-stage A/D converter that can reduce the mismatch errors without adding complexity is desired.

SUMMARY OF THE INVENTION

In view of the above stated circumstances, an object of this invention is to provide a pipelined A/D converter architecture with reduced capacitor mismatch error.

A multistage pipelined analog-to-digital converting architecture in accordance with one embodiment of the present invention includes a sample and hold circuit for sampling an input analog signal and providing an output analog residue signal, which includes a logic circuit configured to receive a first clock signal and a plurality of digital signal bits representing an input analog signal quantized in accordance with a plurality of reference signals and in accordance therewith providing a plurality of control signals; a plurality of reference signal nodes configured to receive said plurality of reference signals; an input signal node configured to receive said input analog signal; an output signal node configured to receive an output analog residue signal; a sample signal node configured to provide an analog sample signal; a first switching node; a second switching node; a circuit reference node configured to provide a circuit ground reference; a first capacitor, coupled between said sample signal node and said first switching node; a second capacitor, coupled between said sample signal node and said second switching node; a signal routing circuit, coupled to said logic circuit and coupled between said sample signal node, said first switching node, said second switching node, said plurality of reference signal nodes, said input node, said output node and said circuit reference node, configured to receive a second clock signal and said plurality of control signals and in accordance therewith selectively couple said sample signal node to said circuit reference node, alternately couple said first switching node to said input node, said output node and said circuit reference node, and alternately couple said second switching node to said input node, said output node and individual ones of said plurality of reference signal nodes; and, an amplifier, coupled between said sample signal node and said output node, configured to receive said sample signal and in accordance therewith provide said output analog residue signal, wherein: one of said plurality of bit patterns represents a range of values of a reference analog residue signal corresponding to a predetermined range of values of said input analog signal and having minimum and maximum reference analog residue signal values which are defined in accordance with said plurality of reference signals; said output analog residue signal includes a range of values between minimum and maximum output analog residue signal values; and said minimum and maximum output analog residue signal values are greater than and less than said minimum and maximum reference analog residue signal values, respectively.

A multistage pipelined analog-to-digital converting architecture in accordance with another embodiment of the present invention includes a differential amplifier with an inverting input and a non-inverting input. Furthermore, the architecture operates the termination of the sampling time period of its sample and hold technique in a staggered, non-overlapping sequence before the amplifying time period is asserted.

These and other features and advantages of the present invention will be understood upon consideration of the following detailed description of the invention and the accompanying drawings.

BRIEF DESCRIPTION OF THE DRAWINGS

FIG. 7C illustrates a signal period of the second embodiment of the present invention where sampling phase is achieved using sequential switching.

DESCRIPTION OF THE PREFERRED EMBODIMENT

Figure 4:
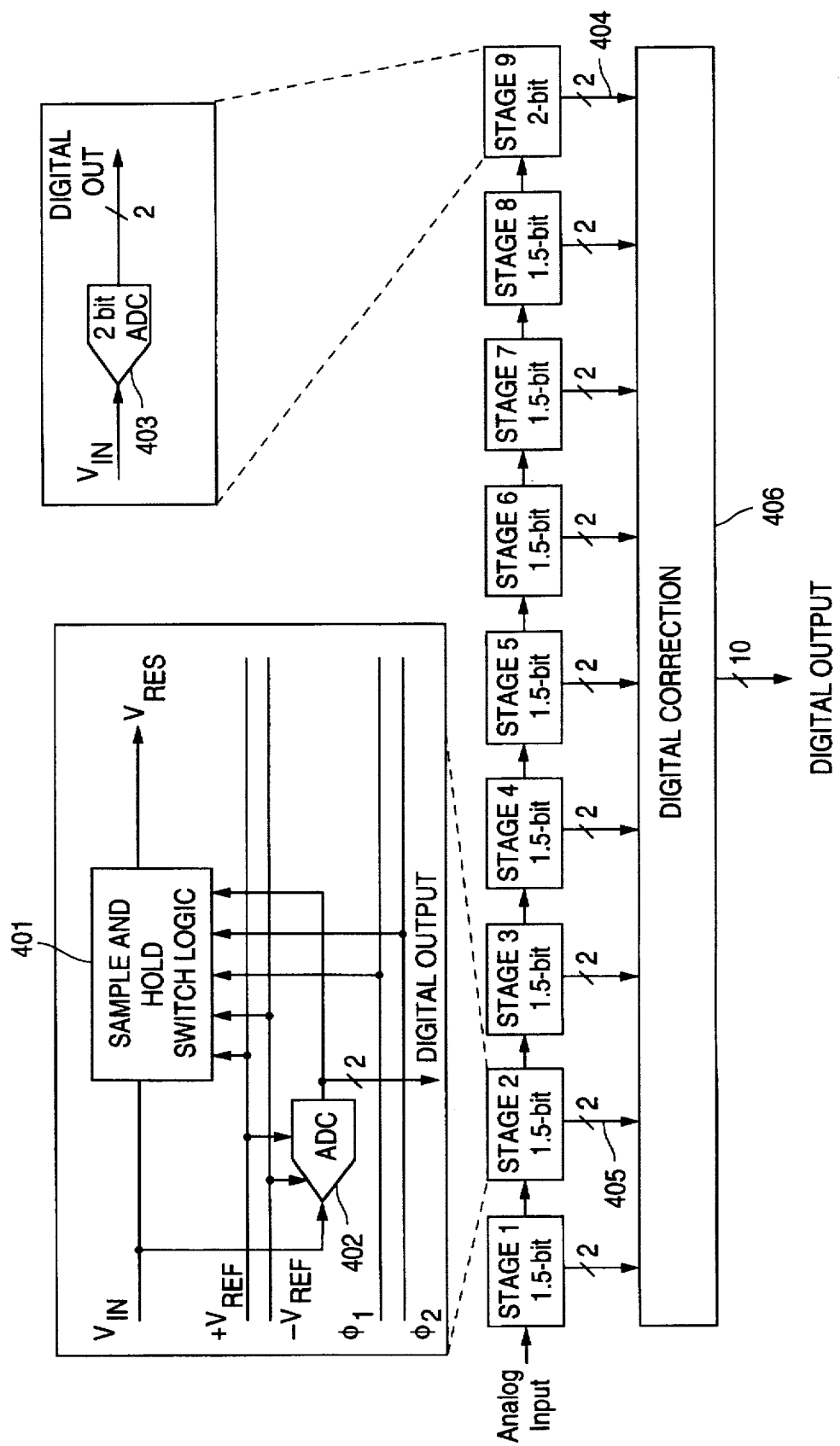
FIG. 4 illustrates a pipelined A/D converter architecture according to the present invention.

FIG. 4 illustrates a pipelined A/D converter according to one embodiment of the present invention. Stage 1 receives an input analog signal to be quantized. This stage samples and quantizes the signal to resolution of 1.5 bit, subtracts the quantized signal, and amplifies the residue by a factor of 2 before passing the signal to the next stage for further conversion. This process continues for each stage of the pipelined structure until the last stage. The last stage which receives, as its input signal, a residue voltage $V_{RES}$ from the immediately prior stage, converts the input signal into 2 digital bit output signal 404 using a 2-bit A/D converter 403. Every stage except the final stage calculates the quantization error and outputs it as a residue voltage $V_{RES}$.

The residue voltage calculation is carried out through an interstage amplifier (FIG. 5A) as embodied in Sample and Hold Switch Logic 401 illustrated in FIG. 4. Reference voltages $+V_{REF}$ and $-V_{REF}$ are the reference voltages used by the A/D subconverter 402 in each of the stages in the pipelined architecture. Clock phase $\phi 1$ determines the sampling time period, while clock phase $\phi 2$ determines the amplifying time period. Clock phases $\phi 1$ and $\phi 2$ are non-overlapping clock signals. Also, FIG. 4 shows a digital correction unit 406 which removes a redundancy in each stage bit resolution that partially contributes to the total output digital signal. Such a digital correction unit can be implemented in accordance with well known techniques.

Figure 5A:
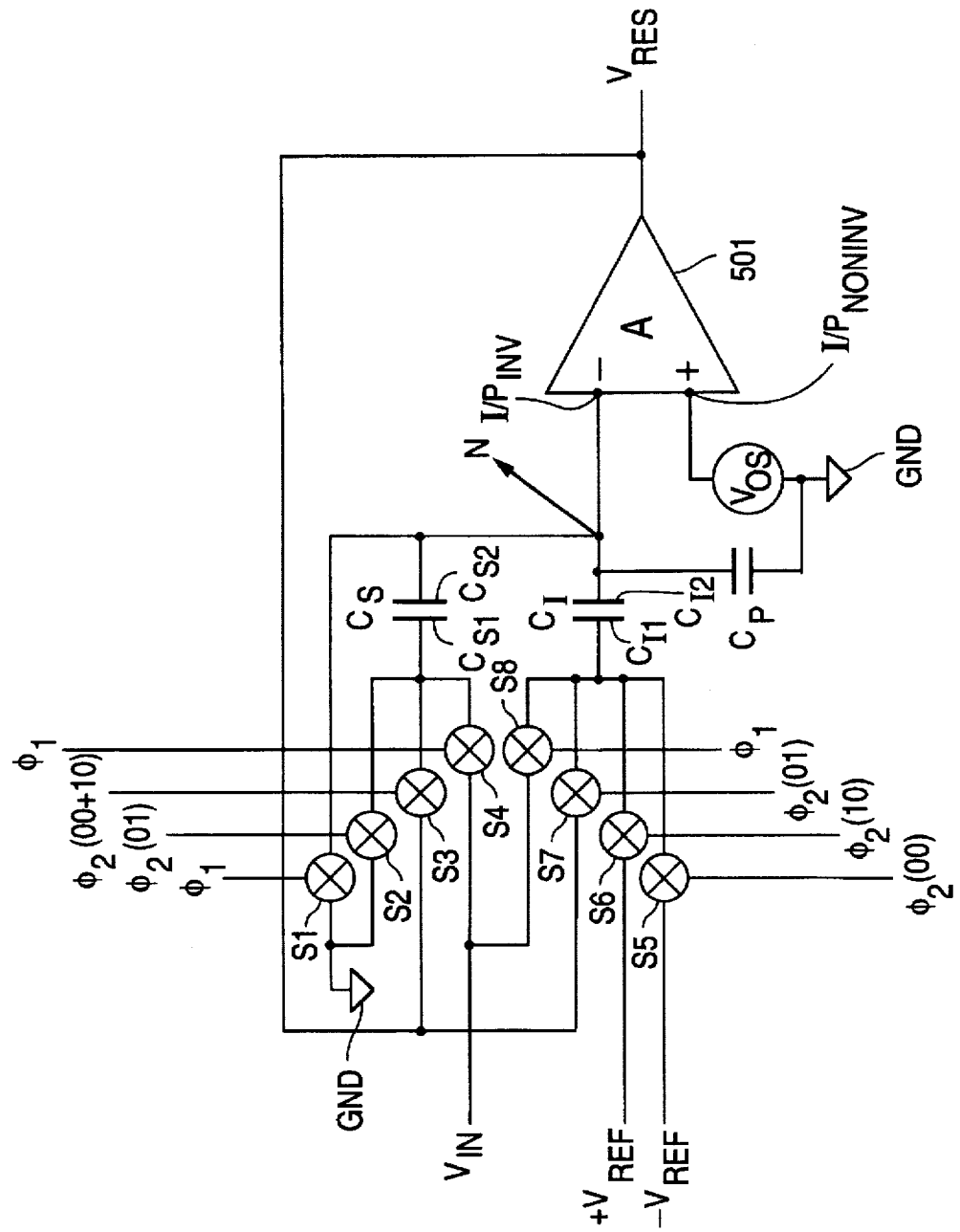
FIG. 5A illustrates the interstage amplifier section of a pipelined A/D converter according to the present invention.

FIG. 5A illustrates in more detail the sampling and amplifying technique as performed by the Sample and Hold Switch Logic 401 of the pipelined A/D converter of FIG. 4.

During the sampling time period, i.e., when clock $\phi 1$ is asserted, switches $S_1$, $S_4$ and $S_8$ are closed. According to one embodiment of the present invention, during the sampling time period ($\phi 1$), a first side $C_{S1}$ of capacitor $C_S$ is connected to the input signal $V_{IN}$ while a second side $C_{S2}$ of the same capacitor $C_S$ which is connected to a common node N, is connected to ground GND. Also during the sampling time period ($\phi 1$), a first side $C_{I1}$ of the capacitor $C_I$ is connected to the input voltage $V_{IN}$ while a second side $C_{I2}$ is connected to the common node N. In turn, the common node N is connected to the inverting input terminal I/P$_{INV}$ at of the amplifier 501. Hence, the input voltage $V_{IN}$ is sampled on both capacitors $C_I$ and $C_S$. Further influencing the common node N is a parasitic capacitance $C_P$ that exists, in practice, between a noninverting input terminal I/P$_{NONINV}$ of the amplifier 501 and common ground GND. Furthermore, in practice, the amplifiers each have an input offset voltage $V_{OS}$ which can be presented as a voltage source between the noninverting input terminal I/P$_{NONINV}$ of the amplifier 501 and common ground GND.

According to one embodiment of the present invention, there are three different ways of switching the capacitors $C_I$ and $C_S$ during the amplifying time period according to the input signal $V_{IN}$ when clock phase $\phi 2$ is asserted.

When the input voltage $V_{IN}$ ranges from $-V_{REF}$ to $-V_{REF}/4$, the A/D subconverter 402 generates output digital code 00, switches $S_3$ and $S_5$ closes while the remaining switches stay open. More specifically, switch $S_3$ connects the first side $C_{S1}$ of capacitor $C_S$ to the output $V_{RES}$ of the amplifier 501, while switch $S_5$ connects the first side $C_{I1}$ of the capacitor $C_I$ to a low reference voltage $-V_{REF}$. The second side $C_{S2}$ of the capacitor $C_S$ and the second side $C_{I2}$ of the capacitor $C_I$ remain connected to the common node N which in turn connects to the inverting input terminal I/P$_{INV}$ of the amplifier 501. Hence, capacitor $C_I$ functions as a sampling capacitor and capacitor $C_S$ functions as an integrating capacitor. It should be noted that the offset voltage $V_{OS}$ between the noninverting input terminal I/P$_{NONINV}$ of the amplifier 501 and common ground GND, and the parasitic capacitance $C_P$ between the common node N and ground GND still exist.

When the input voltage $V_{IN}$ ranges from $-V_{REF}/4$ to $+V_{REF}/4$, the A/D subconverter 402 generates output digital code 01, switches $S_2$ and $S_7$ close, and the remaining switches stay open. In particular, switch $S_2$ connects the first side $C_{S1}$ of capacitor $C_S$ to ground GND, while switch $S_7$ connects the first side $C_{I1}$ of the capacitor $C_I$ to the output $V_{RES}$ of the amplifier 501. The second side $C_{S2}$ of the capacitor $C_S$ and the second side $C_{I2}$ of the capacitor $C_I$ remain connected to the common node N, which, in turn, connects to the inverting input terminal I/P$_{INV}$ of the amplifier 501. Hence, capacitor $C_S$ functions as a sampling capacitor and capacitor $C_I$ functions as an integrating capacitor. Again, it should be noted that the offset voltage $V_{OS}$ between the noninverting input terminal I/P$_{NONINV}$ of the amplifier 501 and ground GND, and the parasitic capacitance $C_P$ between the common node N and the ground GND still exist.

For input signal $V_{IN}$ ranging from $+V_{REF}/4$ to $+V_{REF}$, the A/D subconverter 402 generates output digital code 10, switches $S_3$ and $S_6$ close, and the remaining switches stay open. More specifically, switch $S_3$ connects the first side $C_{S1}$ of capacitor $C_S$ to output $V_{RES}$ of the amplifier 501, while switch $S_7$ connects the first side $C_{I1}$ of the capacitor $C_I$ to a high reference voltage $+V_{REF}$. The second side $C_{S2}$ of the capacitor $C_S$ and the second side $C_{I2}$ of the capacitor $C_I$ remain connected to the common node N which in turn connects to the inverting input terminal I/P$_{INV}$ of the amplifier 501. Hence, capacitor $C_I$ functions as a sampling capacitor and capacitor $C_S$ functions as an integrating capacitor. As before, the offset voltage $V_{OS}$ between the noninverting input terminal I/P$_{NONINV}$ of the amplifier 501 and ground GND, and the parasitic capacitance $C_P$ between the common node N and ground GND still exist.

The above connections are illustrated by the table below representing capacitor connection during the amplifying time period.

TABLE 1

Amplifying Time Period Capacitor Connection

| $V_{IN}$ | Digital Output XY | $C_S$ | $C_I$ |
|---|---|---|---|
| $-V_{REF} < V_{IN} < -V_{REF}/4$ | 00 | $V_{RBS}$ | $-V_{REF}$ |
| $-V_{REF}/4 < V_{IN} < +V_{REF}/4$ | 01 | GND | $V_{RBS}$ |
| $+V_{REF}/4 < V_{IN} < +V_{REF}$ | 10 | $V_{RBS}$ | $+V_{REF}$ |

Figure 5B:
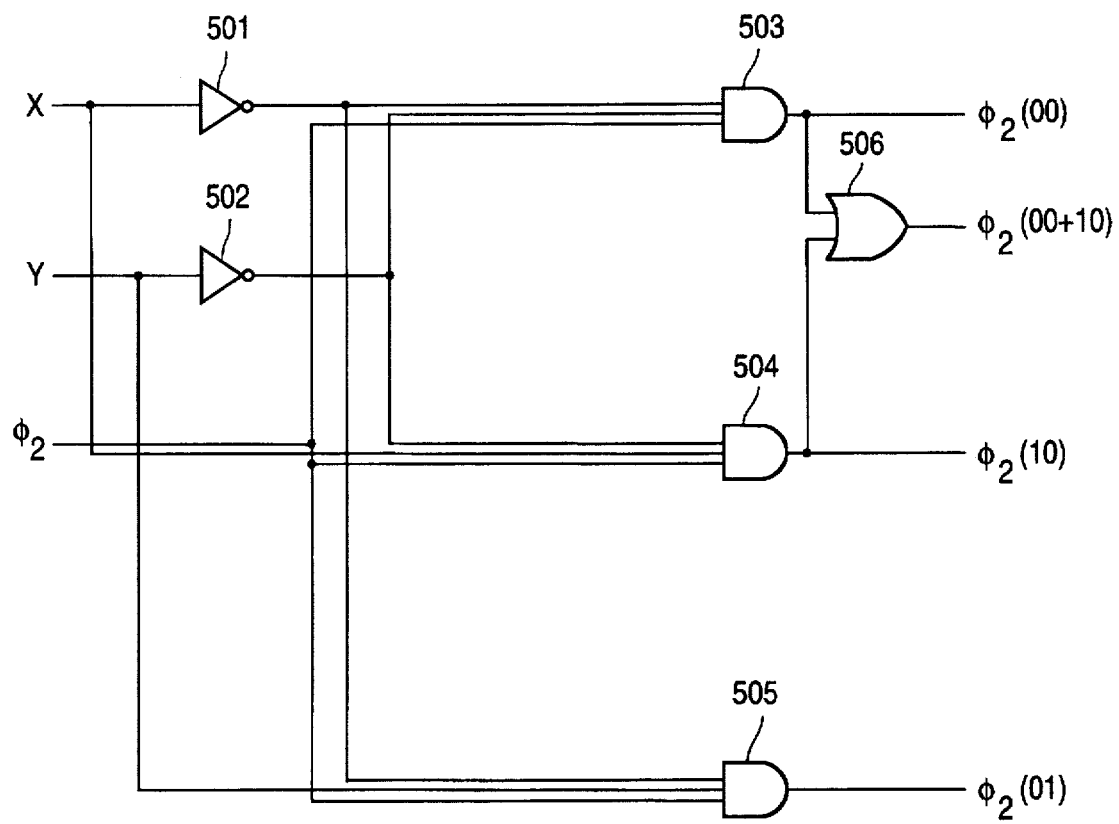
FIG. 5B illustrates switch control logic for use with the sample and hold section of FIG. 5A according to the present invention.

FIG. 5B shows the switch control logic for a signal routing circuit as used for sample and hold technique as illustrated in FIG. 5A for driving switches $S_1$–$S_8$ of FIG. 5A during the amplifying time period ($\phi 2$). As shown, two inverters 501 and 502, three AND gates 503, 504, and 505, and one OR gate 506 are used with X and Y representing the output digital code 405 from each stage as shown in FIG. 4 and in the above table.

For X=0, Y=0, the output of AND gate 503 is high while the outputs of the remaining two AND gates 504, 505 remain low, turning on switches $S_3$ and $S_5$. For X=0, Y=1, the output of AND gate 505 is high while the outputs of the remaining two AND gates 503, 504 remain low, turning on switches $S_2$ and $S_7$. Finally, for X=1, Y=0, the output of AND gate 504 is high while the outputs of the remaining two AND gates 503, 505 remain low, turning on switches $S_3$ and $S_6$.

The relationship between the residue voltage $V_{RES}$ and the input voltage $V_{IN}$ with respect to the capacitors $C_S$, $C_I$, $C_P$, $V_{OS}$, and the amplifier gain A can be illustrated by the following expressions:

$$V_{RES} = V_{IN}*(1 + C_I/C_S)/(1 + (C_S + C_I + C_P)/C_S*A) - \quad (14)$$
$$K*V_{REF}*(C_I/C_S)/(1 + (C_S + C_I + C_P)/C_S*A) +$$
$$V_{OS}*((C_S + C_I + C_P)/C_S)/(1 + (C_S + C_I + C_P)/C_S*A)$$

Where K=−1.0 for $-V_{REF} < V_{IN} < -V_{REF}/4$, and K=+1.0 for $+V_{REF}/4 < V_{IN} < +V_{REF}$. And, $$V_{RES} = V_{IN}*(1 + C_I/C_S)/(1 + (C_S + C_I + C_P)/C_I*A) - \quad (15)$$
$$K*V_{REF}*(C_I/C_S)/(1 + (C_S + C_I + C_P)/C_I*A) +$$
$$V_{OS}*((C_S + C_I + C_P)/C_I)/(1 + (C_S + C_I + C_P)/C_I*A)$$

Where K=0 for $-V_{REF}/4 < V_{IN} < +V_{REF}/4$.

In FIG. 5A, the amplifier 501 has a gain A. In addition, the offset voltage $V_{OS}$ between the non-inverting input terminal of the amplifier 501 and ground GND, and the parasitic capacitance $C_P$ between the common node N and ground GND, can be assumed to be negligible. Furthermore, assuming gain A of amplifier 501 is very large and taking the capacitor mismatch factor as $\alpha$, we obtain the following expressions.

$$C_I = C \quad (16)$$

$$C_S = C*(1+\alpha) \quad (17)$$

Where C is a common capacitance factor.

Since $1/(1+\alpha)$ can be approximated to $(1-\alpha)$ for $\alpha<<1$, the following expression can be derived for the change in offset voltage $\Delta V_1$ (FIG. 6) for input voltage Vin of $-Vref/4$ where the output digital code 407 (FIG. 4) changes from 00 to 01.

$$\Delta V_1 = V_{RES1} - V_{RES2} \approx V_{REF}*(1-\alpha/2) \quad (18)$$

Figure 6:
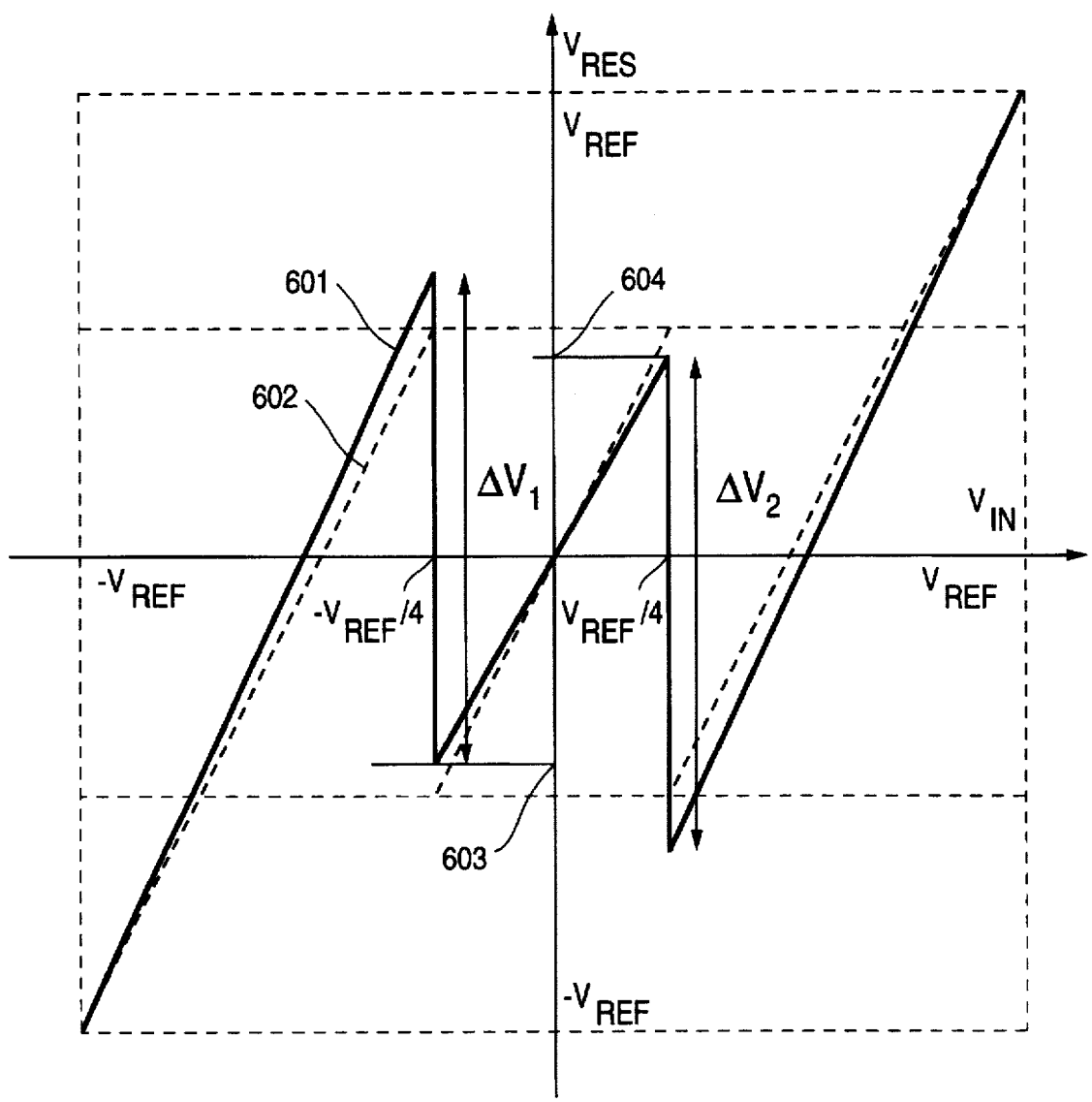
FIG. 6 illustrates a residue voltage response of one stage of a pipelined A/D converter according to the present invention.

A similar expression to (18) for the change in offset voltage $\Delta V_2$ as shown in FIG. 6 can be obtained for input signal $V_{IN}$ of $+Vref/4$ where the output digital code 407 (FIG. 4) changes from 01 to 10 as shown by the following expression.

$$\Delta V_2 = V_{RES2} - V_{RES3} \approx V_{REF}*(1-\alpha/2) \quad (19)$$

From equations (18) and (19) it can be seen that capacitor mismatch error in the present invention is reduced by a factor of two compared to a conventional scheme as shown in Equations (12) and (13).

Figure 1:
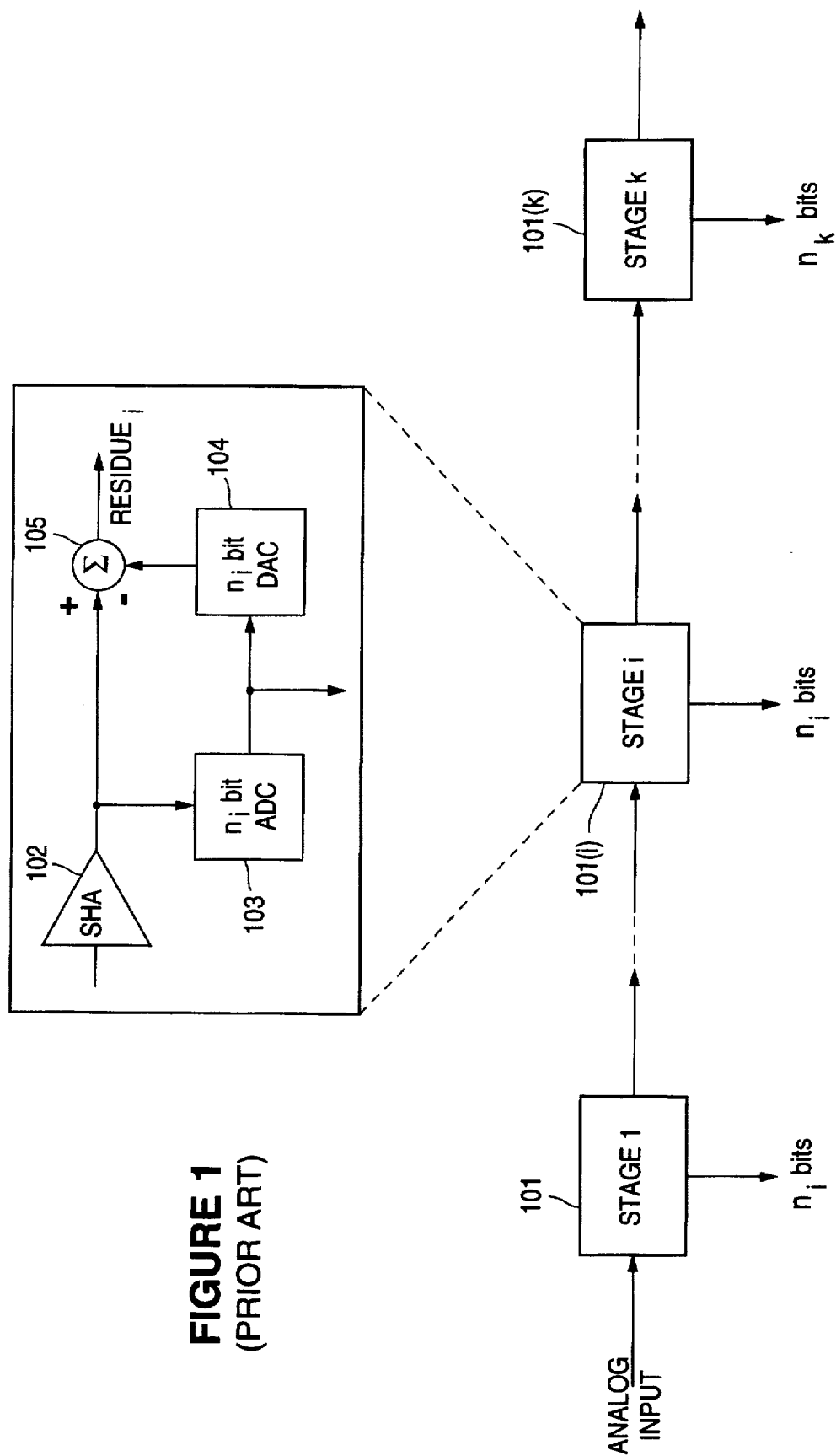
FIG. 1 illustrates a conventional pipelined architecture of an analog to digital converter.
Figure 2:
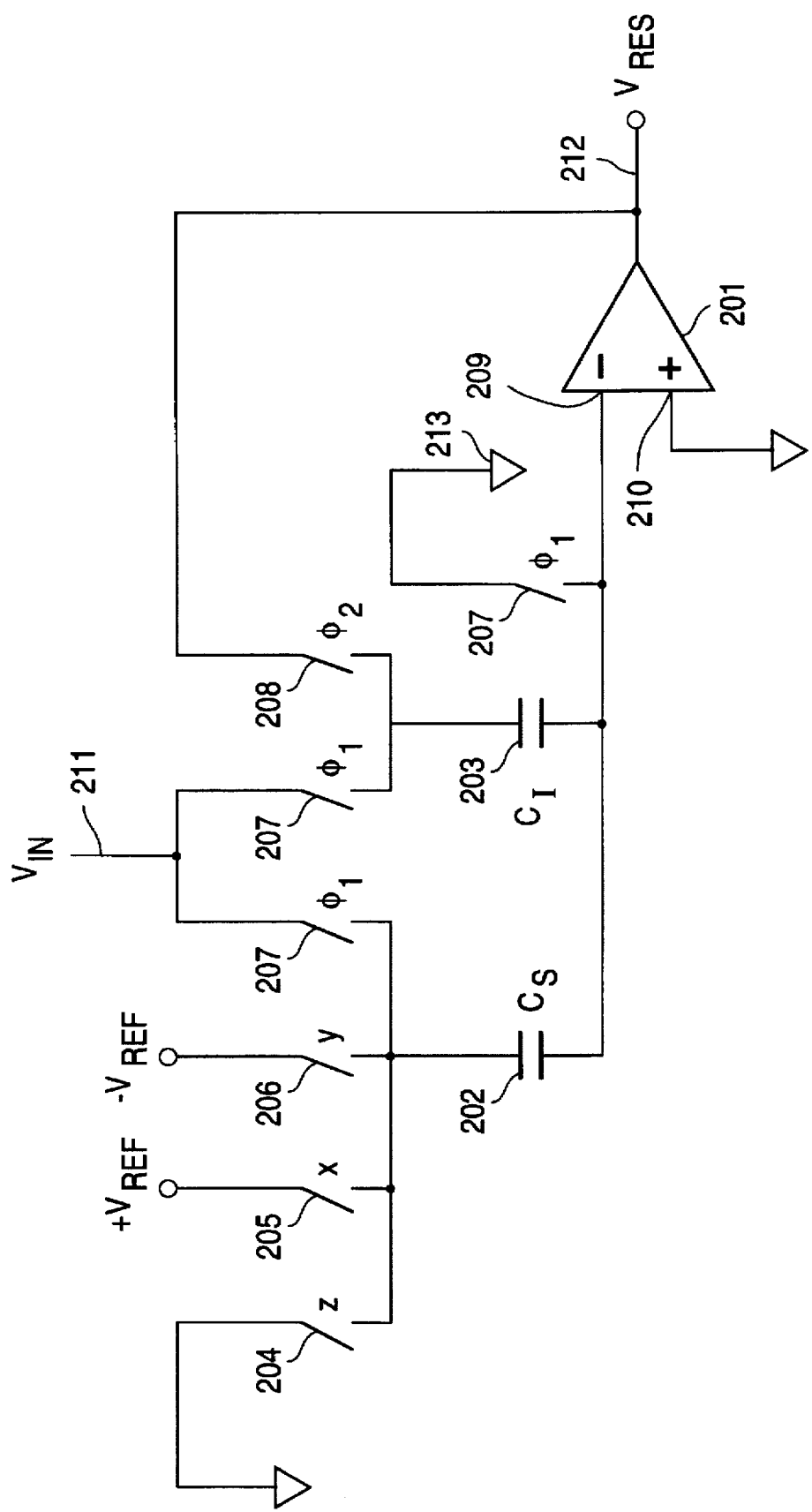
FIG. 2 illustrates a conventional 1.5-bit resolution stage for a multistage A/D converter with a pipelined architecture of FIG. 1.
Figure 3A:
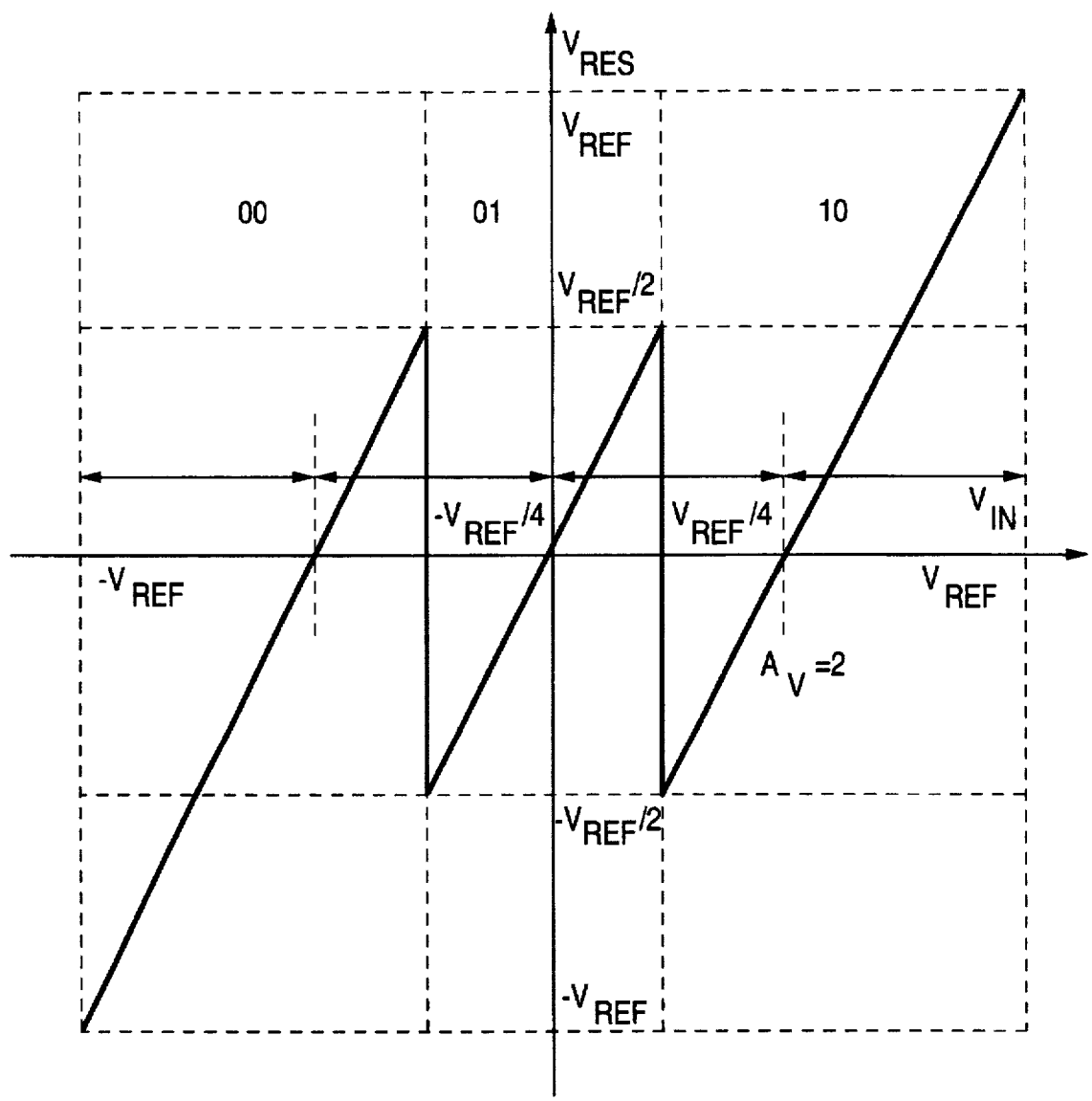
FIG. 3A illustrates an ideal residue voltage response of a conventional converter stage.
Figure 3B:
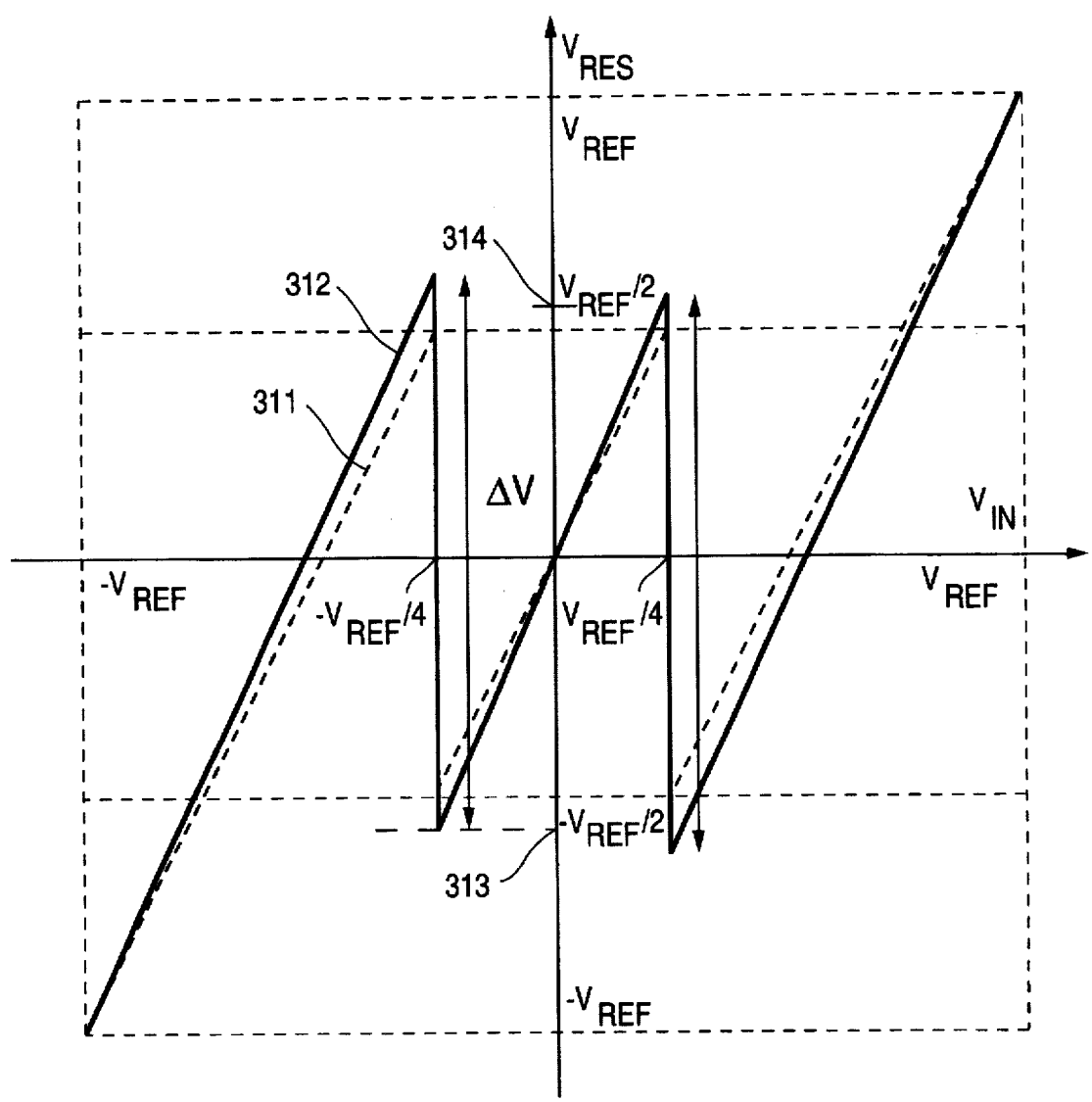
FIG. 3B contrasts the residue voltage response of an ideal stage as shown in FIG. 3A to that of an actual stage of a multistage pipelined A/D converter as shown in FIG. 2.

FIG. 6 shows the residue signal versus input signal plot of the resulting analog to digital conversion. Contrasting the residue signal response 601 of the present invention with the ideal residue signal response 602, it can be observed that the gradient of the residue signal response according to the present invention is less than the gradient for the ideal residue signal response 602. It can be seen from FIG. 3B which illustrates the conventional residue signal response that the gradient for the conventional residue signal response 312 is steeper than the gradient for the ideal residue signal response 311 for input voltage $V_{IN}$ ranging between $-V_{REF}/4$ and $+V_{REF}/4$. By contrast, the plot for the present invention 601 in FIG. 6 shows a significant reduction in residue signal at the two transition points where the input signal Vin equals $-Vref/4$ and $+Vref/4$. In particular, by comparing the value of the residue signal at transition points 603 and 604 of FIG. 6 to the transition points 313 and 314 of FIG. 3B, it can be seen that the magnitude of capacitor mismatch is effectively reduced by approximately half. This illustrates significant reduction in non-linearity of the A/D converter.

Figure 7A:
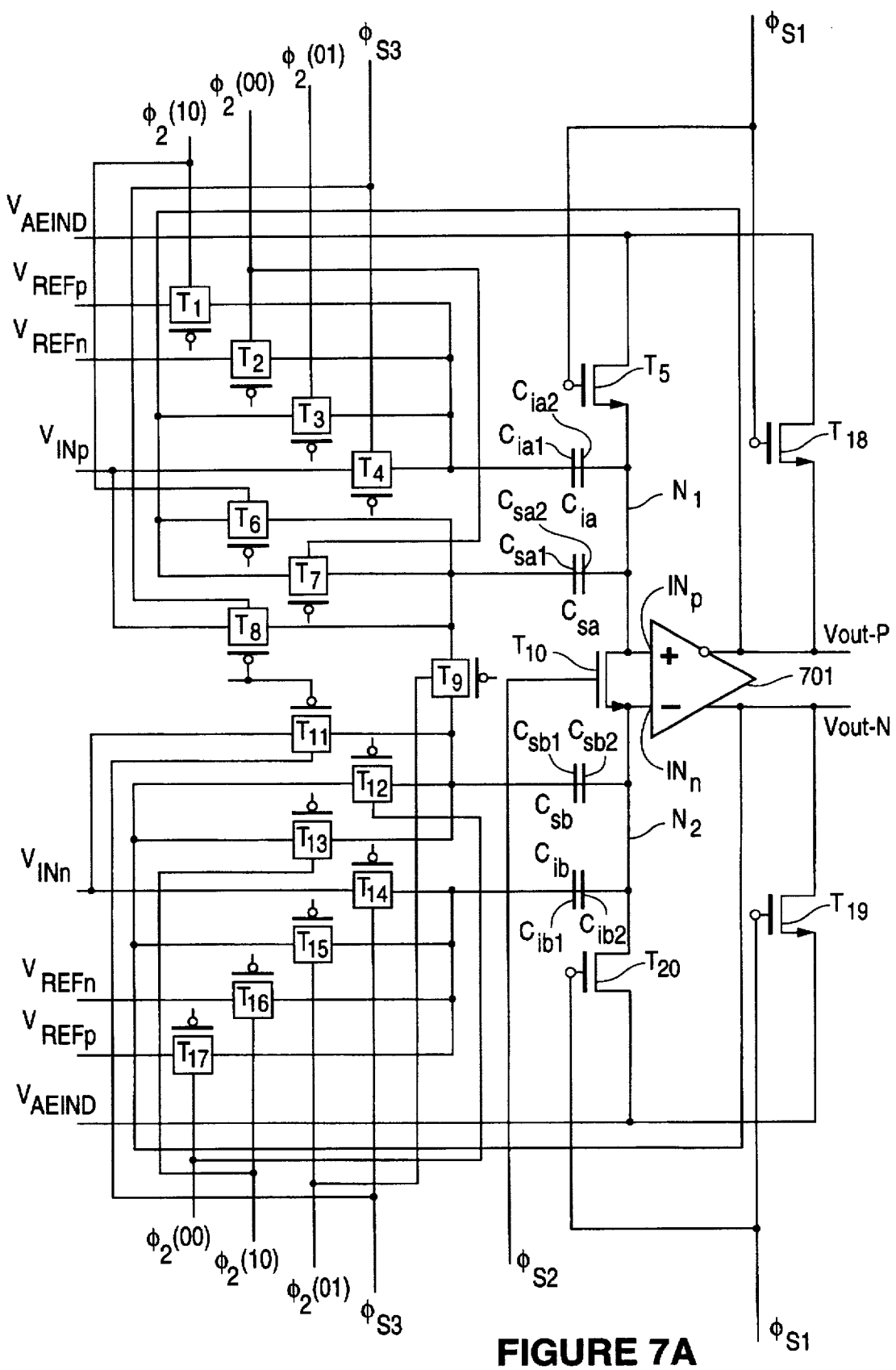
FIG. 7A illustrates a second embodiment of the present invention having a differential amplifier.

According to another embodiment of the present invention, a differential amplifier having an inverting and a non-inverting inputs are used. FIG. 7A illustrates the switching diagram of the sampling and the amplifying time periods $\phi 1$ and $\phi 2$ respectively of the present invention according to the second embodiment.

In FIG. 7A, complementary metal-oxide semiconductor (CMOS) transmission gates are used as the switches controlled by the switch control logic. As before, there are three different ways of switching the capacitors $C_{Ia}$ and $C_{Sa}$, $C_{Ib}$, and $C_{Sb}$ during the amplifying time period, i.e., when clock phase $\phi 2$ is asserted, depending on the input signals $V_{INp}$ and $V_{INn}$. (Although for the sake of simplifying the figure only the primary phases of the various control signals which drive the individual transmission gates have are shown, it should be understood that both the non-inverted and inverted phases of each control signal are used to drive their respective transmission gate(s). For example, even though only the non-inverted phases of control signals $\phi 2(10)$ and $\phi_{S3}$ are shown as driving the NMOS portions of transmission gate $T_1$ and transmissions gates $T_8$ and $T_{11}$, respectively, it should be understood that their respective inverted phases/$\phi 2(10)$ and/$\phi_{S3}$ are driving the PMOS portions as well.)

During the amplifying time period, for output digital code 00, transmission gates $T_2$, $T_7$, $T_{12}$, and $T_{17}$ turn on while the remaining switches are turn off. More specifically, gate $T_2$ connects the first side $C_{Ia1}$ of capacitor $C_{Ia}$ to a lower reference voltage $V_{REFn}$ while switch $T_7$ connects the first side $C_{Sa1}$ of the capacitor $C_{Sa}$ to the output $V_{OUTp}$ of the differential amplifier 701. The second side $C_{Sa2}$ of the capacitor $C_{Sa}$ and the second side $C_{Ia2}$ of the capacitor $C_{Ia}$ remain connected to a first common node $N_1$ which in turn connects to the non-inverting input terminal $IN_p$ of the differential amplifier 701. In addition, gate $T_{17}$ connects the first side $C_{Ib1}$ of capacitor $C_{Ib}$ to a higher reference voltage $V_{REFp}$ while switch $T_{12}$ connects the first side $C_{Sb1}$ of the capacitor $C_{Sb}$ to the output $V_{OUTn}$ of the differential amplifier 701. The second side $C_{Sb2}$ of the capacitor $C_{Sb}$ and the second side $C_{Ib2}$ of the capacitor $C_{Ib}$ remain connected to a second common node $N_2$ which in turn connects to the inverting input terminal $IN_N$ of the differential amplifier 501.

For output digital code 01, transmission gates $T_3$, $T_9$, and $T_{15}$ turn on, while the remaining gates are turn off. Gate $T_9$ connects the first side $C_{Sa1}$ of capacitor $C_{Sa}$ to the first side $C_{Sb1}$ of capacitor $C_{Sb}$, gate $T_3$ connects the first side $C_{Ia1}$ of the capacitor $C_{Ia}$ to the output $V_{OUTp}$ of the differential amplifier 701, and gate $T_{15}$ connects the first side $C_{Ib1}$ of capacitor $C_{Ib}$, to output $V_{OUTn}$ of the differential amplifier 701. The second side $C_{Sa2}$ of the capacitor $C_{Sa}$ and the second side $C_{Ia2}$ of the capacitor $C_{Ia}$ remain connected to the first common node $N_1$, which, in turn, connects to the non-inverting input terminal $IN_p$ of the differential amplifier 701. The second side $C_{Sb2}$ Of the capacitor $C_{Sb}$ and the second side $C_{Ib2}$ of the capacitor $C_{Ib}$ remain connected to the second common node $N_2$, which, in turn, connects to the inverting input terminal $IN_n$ of the differential amplifier 701.

For output digital code 10, transmission gates $T_1$, $T_6$, $T_{13}$, and $T_{16}$ turn on while the remaining gates mm off. Gate $T_6$ connects the first side $C_{Sa1}$ of capacitor $C_{Sa}$ to output $V_{OUTp}$ of the differential amplifier 701, while switch $T_1$ connects the first side $C_{Ia1}$ of the capacitor $C_{Ia}$ to a high reference voltage $V_{REFp}$. The second side $C_{Sa2}$ of the capacitor $C_{Sa}$ and the second side $C_{Ia2}$ of the capacitor $C_{Ia}$ remain connected to the first common node $N_1$ which in turn connects to the non-inverting input terminal $IN_p$ of the differential amplifier 701. Furthermore, gate $T_{13}$ connects the first side $C_{Sb1}$ of capacitor $C_{Sb}$ to output $V_{OUTn}$ of the differential amplifier 701, while switch $T_{16}$ connects the first side $C_{Ib1}$ of the capacitor $C_{Ib}$ to a low reference voltage $V_{REFn}$. The second side $C_{Sb2}$ of the capacitor $C_{Sb}$ and the second side $C_{Ib2}$ of the capacitor $C_{Ib}$ remain connected to the second common node $N_2$ which in turn connects to the inverting input terminal $IN_n$ of the differential amplifier 701.

During the sampling time period, i.e., when clock $\phi 1$ is asserted, transmission gates $T_4$, $T_5$, $T_8$, $T_{10}$, $T_{11}$, $T_{14}$, $T_{18}$, $T_{19}$, and $T_{20}$ are turned on. At the beginning of the sampling time period $\phi 1$, all nine transmission gates above are mined on at the same time. However, at the termination of the sampling time period, the nine transmission gates $T_4$, $T_5$, $T_8$, $T_{10}$, $T_{11}$, $T_{14}$, $T_{18}$, $T_{19}$, and $T_{20}$ are turned off in the following order. First, gates $T_5$, $T_{18}$, $T_{19}$, and $T_{20}$ are turned off. Then, gate $T_{10}$ is mined off. Thereafter, gates $T_4$, $T_8$, $T_{11}$, and $T_{14}$ are turned off. Subsequent to the termination of the sampling time period, since the two clock phases $\phi 1$ and $\phi 2$ are non-overlapping, clock phase $\phi 2$ is asserted thereby beginning the amplifying time period. The above sequential switching for termination of the sampling period is illustrated by the table below.

TABLE 2

Sampling Time Period Termination Switching Sequence

| Switching Order | $T_4$ | $T_5$ | $T_8$ | $T_{10}$ | $T_{11}$ | $T_{14}$ | $T_{18}$ | $T_{19}$ | $T_{20}$ |
|---|---|---|---|---|---|---|---|---|---|
| $\phi_{S1} \downarrow$ | X | O | X | X | X | X | O | O | O |
| $\phi_{S2} \downarrow$ | X | O | X | O | X | X | O | O | O |
| $\phi_{S3} \downarrow$ | O | O | O | O | O | O | O | O | O |

Where X indicates that the transmission gate is mined on, and O indicates that the transmission gate is turned off, and furthermore, where $\phi_{S1}$, $\phi_{S2}$, and $\phi_{S3}$ make up the first clock phase $\phi 1$ and $\Downarrow$, indicates a high-to-low transition of the signal.

During the first sequential switching $\phi_{S1}$ at the termination of the sampling time period, gate $T_5$ disconnects the first common node $N_1$ from ground $V_{AGND}$ while gate $T_{18}$ disconnects the first output $V_{OUTp}$ from ground $V_{AGND}$. Also, during this sequential switching, gate $T_{20}$ disconnects the second common node $N_2$ from ground $V_{AGND}$ while gate $T_{19}$ disconnects output $V_{OUTn}$ from ground $V_{AGND}$. During the second switching $\phi_{S2}$, gate $T_{10}$ disconnects the first common node $N_1$ from the second common node $N_2$. Finally, during the last sequential switching $\phi_{S3}$, gate $T_4$ disconnects input $V_{INp}$ from the first side $C_{Ia1}$ of capacitor $C_{I1}$ while gate $T_{14}$ disconnects input $V_{INn}$ from the first side $C_{Ib1}$ of the capacitor $C_{Ib}$. Also during this sequential switching $\phi_{S3}$, gate $T_8$ disconnects the input $V_{INp}$ from the first side $C_{Sa1}$ of the capacitor $C_{Sa}$ while gate $T_{11}$ disconnects input $V_{INn}$ from the first side $C_{Sb1}$ of the capacitor $C_{Sb}$.

FIG. 7C further shows the timing of the sequential switching for the termination of the sampling phase as illustrated in TABLE 2. In particular, it can be seen that sequential switching $\phi_{S1}$ terminates at time period $T_{S1}$, sequential switching $\phi_{S2}$ terminates at time period $T_{S2}$, and sequential switching $\phi_{S3}$ terminates at $T_{S3}$. Furthermore, it can be readily seen from FIG. 7C that only after the last sequential switching $\phi_{S3}$ terminates does the amplifying time period $\phi_2$ commence. It is also evidence from FIG. 7C that the sampling time period $\phi_1$ (made up of $\phi_{S1}$, $\phi_{S2}$, and $\phi_{S3}$) and the amplifying time period $\phi_2$ are non-overlapping.

It should be noted that the sequential switching for sampling time period termination allows for the advantageous reduction in charge injection.

Figure 7B:
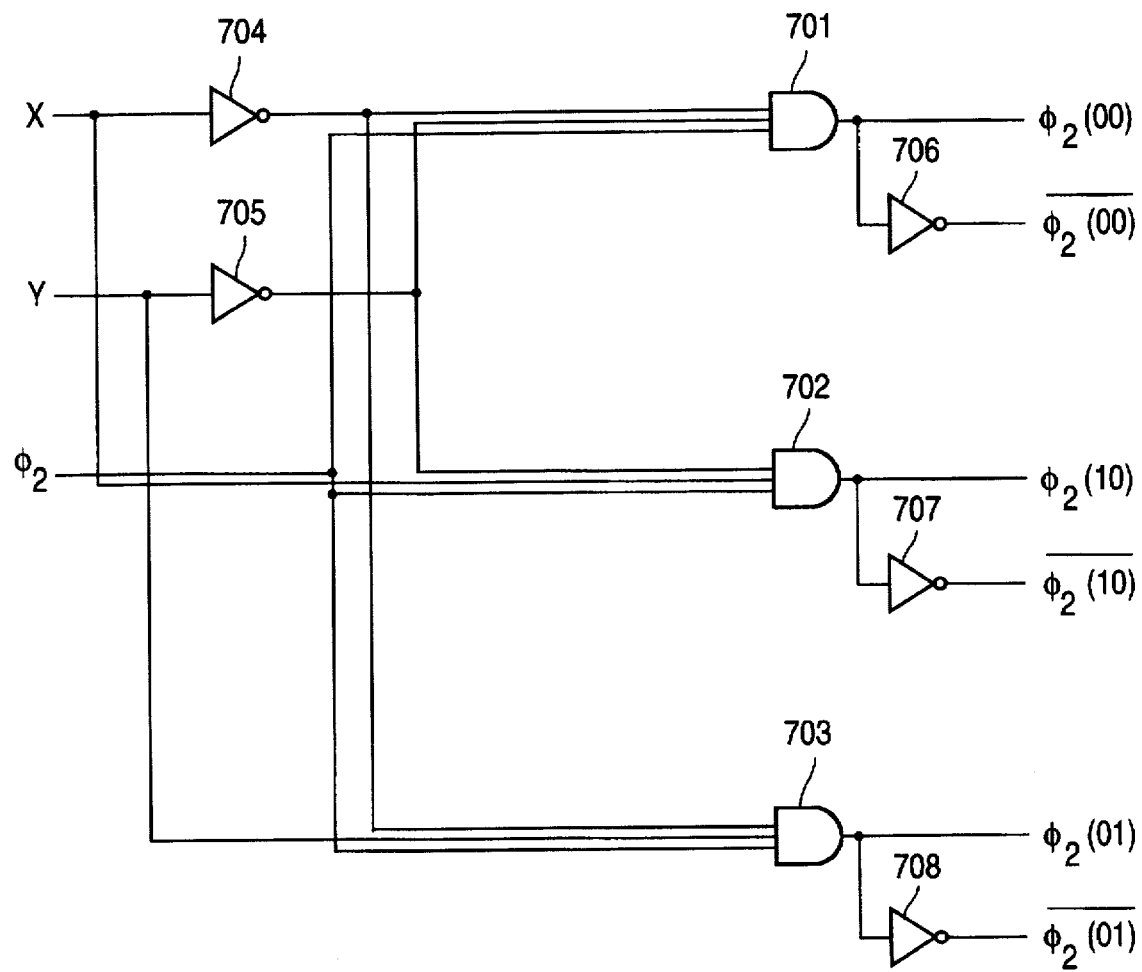
FIG. 7B illustrates switch control logic for use with the sample and hold section of FIG. 7A according to the present invention.

FIG. 7B illustrates the switch control logic for the sample and hold technique as illustrated in FIG. 7A driving CMOS transmission gates $T_1$–$T_{20}$. In particular, FIG. 7B shows three AND gates 701, 702, and 703, and five inverters 704, 705, 706, 707, and 708. For input digital code X=0, Y=0, an AND operation by AND gate 701 and an inverting operation upon the output of the AND gate 701 turns on transmission gates $T_2$, $T_7$, $T_{12}$, and $T_{17}$. For input digital code X=0, Y=1, an AND operation by the AND gate 703 and an inverting operation upon the output of the AND gate 703 turns on transmission gates $T_3$, $T_9$, and $T_{15}$. Finally, for input digital code X=1, Y=0, an AND operation by the AND gate 702 and an inverting operation upon the output of the AND gate 702 turns on transmission gates $T_1$, $T_6$, $T_{13}$, and $T_{16}$. This switch control logic can be further illustrated by TABLE 3 below.

TABLE 3

Switch Control Logic for Sample and Hold Technique using Differential Amplifier During Amplifying Time Period.

| Digital Output | $T_1$ | $T_2$ | $T_3$ | $T_6$ | $T_7$ | $T_9$ | $T_{12}$ | $T_{13}$ | $T_{15}$ | $T_{16}$ | $T_{17}$ |
|---|---|---|---|---|---|---|---|---|---|---|---|
| 00 | O | X | O | O | X | O | X | O | O | X | |
| 01 | O | O | X | O | O | X | O | O | X | O | O |
| 10 | X | O | O | X | O | O | O | X | O | X | O |

Where O indicates that the transmission gate is turned off, and X indicates that the transmission gate is turned on.

In this manner, it can be seen that the linearity of the pipelined A/D converter architecture is significantly enhanced as a result of reducing mismatch between the capacitors in the architecture and method presented by this invention.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sample and hold circuit for use in a pipelined analog-to-digital converter for sampling and holding an input analog signal and providing an output analog residue signal, comprising:

a logic circuit configured to receive a logic clock signal and a plurality of digital signal bits and in accordance therewith provide a plurality of control signals, wherein said digital signal bits include a plurality of bit patterns and represent an input analog signal which has been quantized in accordance with a plurality of reference signals;

a plurality of reference signal ports configured to receive said plurality of reference signals;

an input signal port configured to receive said input analog signal;

an output signal port configured to receive an output analog residue signal;

a sample signal port configured to receive an analog sample signal;

a first switching port;

a second switching port;

a circuit reference port configured to provide a circuit ground reference;

a first capacitance, coupled between said sample signal port and said first switching port;

a second capacitance, coupled between said sample signal port and said second switching port;

a signal routing circuit, coupled to said logic circuit and coupled between said sample signal port, said first switching port, said second switching port, said plurality of reference signal ports, said input signal port, said output signal port and said circuit reference port, configured to receive at least one routing clock signal and said plurality of control signals and in accordance therewith selectively couple said sample signal port to said circuit reference port, alternately couple said first switching port to said input signal port, said output signal port and said circuit reference port, and alternately couple said second switching port to said input signal port, said output signal port and individual ones of said plurality of reference signal ports and in accordance therewith provide said analog sample signal; and an amplifier, coupled between said sample signal port and said output signal port, configured to receive said analog sample signal and in accordance therewith provide said output analog residue signal;

wherein:

one of said plurality of bit patterns represents a range of values of a reference analog residue signal corresponding to a predetermined range of values of said input analog signal and having minimum and maximum reference analog residue signal values which are defined in accordance with said plurality of reference signals;

said output analog residue signal includes a range of values between minimum and maximum output analog residue signal values; and said minimum and maximum output analog residue signal values are greater than and less than said minimum and maximum reference analog residue signal values, respectively.

2. The apparatus of claim 1, wherein said logic circuit comprises a plurality of logic gates configured to receive and logically process said logic clock signal and said plurality of digital signal bits and in accordance therewith generate said plurality of control signals.

3. The apparatus of claim 1, wherein:

said plurality of reference signal ports, said input signal port, said output signal port, said sample signal port, said first switching port and said second switching port comprise a plurality of single ended signal nodes; and said plurality of reference signals, said input analog signal, said output analog residue signal and said analog sample signal comprise a plurality of single ended signals.

4. The apparatus of claim 1, wherein:

said plurality of reference signal ports, said input signal port, said output signal port, said sample signal port, said first switching port and said second switching port comprise a plurality of differential signal nodes; and said plurality of reference signals, said input analog signal, said output analog residue signal and said analog sample signal comprise a plurality of differential signals.

5. The apparatus of claim 4, wherein said first and second capacitances comprise first and second differential capacitive circuits.

6. The apparatus of claim 1, wherein said amplifier comprises a differential amplifier.

7. The apparatus of claim 1, wherein:

said signal routing circuit comprises a plurality of transmission gates; and said plurality of control signals comprises a plurality of differential signals.

8. The apparatus of claim 1, wherein said signal routing circuit comprises:

a first switching circuit, coupled between said sample signal port and said circuit reference port, configured to receive said at least one routing clock signal and in accordance therewith selectively couple said sample signal port to said circuit reference port;

a first plurality of switching circuits, coupled to said logic circuit and coupled between said first switching port, said input signal port and said output signal port, configured to receive said at least one routing clock signal and a portion of said plurality of control signals and in accordance therewith alternately couple said first switching port to said input signal port and said output signal port; and a second plurality of switching circuits, coupled to said logic circuit and coupled between said second switching port and said plurality of reference signal ports, said input signal port and said output signal port, configured to receive said at least one routing clock signal and another portion of said plurality of control signals and in accordance therewith alternately couple said second switching port to said input signal port, said output signal port and individual ones of said plurality of reference signal ports.

9. The apparatus of claim 8, wherein:

said plurality of reference signal ports, said input signal port, said output signal port, said sample signal port, said first switching port and said second switching port comprise a plurality of differential signal nodes;

said plurality of reference signals, said input analog signal, said output analog residue signal and said analog sample signal comprise a plurality of differential signals;

said first switching circuit comprises a plurality of pass gates; and said first and second pluralities of switching circuits comprise first and second pluralities of transmission gates.

10. A method of sampling and holding an input analog signal and providing an output analog residue signal for use in a pipelined analog-to-digital conversion, said method comprising the steps of:

receiving a logic clock signal and a plurality of digital signal bits and in accordance therewith generating a plurality of control signals, wherein said digital signal bits include a plurality of bit patterns and represent an input analog signal which has been quantized in accordance with a plurality of reference signals;

receiving said plurality of reference signals;

receiving said input analog signal;

receiving an output analog residue signal;

receiving at least one routing clock signal and said plurality of control signals and in accordance therewith selectively charging a first capacitance with said input analog signal and said output analog residue signal and selectively charging a second capacitance with said input analog signal, said output analog residue signal and said plurality of reference signals and in accordance therewith generating said analog sample signal; and amplifying said analog sample signal and in accordance therewith generating said output analog residue signal;

wherein:

one of said plurality of bit patterns represents a range of values of a reference analog residue signal corresponding to a predetermined range of values of said input analog signal and having minimum and maximum reference analog residue signal values which are defined in accordance with said plurality of reference signals;

said output analog residue signal includes a range of values between minimum and maximum output analog residue signal values; and said minimum and maximum output analog residue signal values are greater than and less than said minimum and maximum reference analog residue signal values, respectively.

11. The method of claim 10, wherein said steps of receiving said plurality of reference signals, receiving said input analog signal and receiving an output analog residue signal comprise receiving a plurality of single ended signals.

12. The method of claim 10, wherein said steps of receiving said plurality of reference signals, receiving said input analog signal and receiving an output analog residue signal comprise receiving a plurality of differential signals.

13. The method of claim 12, wherein said step of receiving at least one routing clock signal and said plurality of control signals and in accordance therewith selectively charging a first capacitance with said input analog signal and said output analog residue signal and selectively charging a second capacitance with said input analog signal, said output analog residue signal and said plurality of reference signals and in accordance therewith generating said analog sample signal comprises selectively charging a first differential capacitive circuit with said input analog signal and said output analog residue signal and selectively charging a second differential capacitive circuit with said input analog signal, said output analog residue signal and said plurality of reference signals.

14. The method of claim 10, wherein said step of amplifying said analog sample signal and in accordance therewith generating said output analog residue signal comprises differentially amplifying said analog sample signal and in accordance therewith generating said output analog residue signal as a differential output signal.

15. The method of claim 10, wherein said step of receiving at least one routing clock signal and said plurality of control signals and in accordance therewith selectively charging a first capacitance with said input analog signal and said output analog residue signal and selectively charging a second capacitance with said input analog signal, said output analog residue signal and said plurality of reference signals and in accordance therewith generating said analog sample signal comprises:

receiving said at least one routing clock signal and a portion of said plurality of control signals and in accordance therewith selectively charging said first capacitance with said input analog signal and said output analog residue signal;

receiving said at least one routing clock signal and another portion of said plurality of control signals and in accordance therewith selectively charging said second capacitance with said input analog signal, said output analog residue signal and said plurality of reference signals; and combining electrical charges from said first and second capacitances and in accordance therewith generating said analog sample signal.

* * * * *